United States Patent [19]

Lelental et al.

[11] Patent Number: 5,204,313
[45] Date of Patent: Apr. 20, 1993

[54] PROCESS OF FORMING A HIGH TEMPERATURE SUPERCONDUCTOR ON A METAL SUBSTRATE SURFACE

[75] Inventors: Mark Lelental; Henry J. Romanofsky, both of Rochester, N.Y.

[73] Assignee: Eastman Kodak Company, Rochester, N.Y.

[21] Appl. No.: 773,830

[22] Filed: Oct. 10, 1999

Related U.S. Application Data

[63] Continuation of Ser. No. 623,639, Dec. 7, 1990, abandoned.

[51] Int. Cl.$^5$ .......................... B05D 5/12; B05D 3/02
[52] U.S. Cl. ........................................ 505/1; 505/734; 505/742; 427/62; 427/226
[58] Field of Search .................... 505/1, 734, 742, 782; 427/62, 63, 226

[56] References Cited

U.S. PATENT DOCUMENTS 4,988,674  1/1991  Mir et al. ................................. 505/1

OTHER PUBLICATIONS

Maruyama et al., "High-Tc Superconducting Bi-Pb-Sr-Ca-Cu-O Thin Films Prepared by Thermal Decomposition of Metallic Complex Salts", Jpn. J. Appl. Phys. lett. 28(4) Apr. 1989, pp. L624-L627.
Kampwirth et al., "Properties of Sputtered Superconducting Films of $Bi_2Sr_2CaCu_2O_x$ Made of Low-Temperature In Situ Growth", Appl. Phys. lett. 55(20) Nov. 1989, pp. 2135-2137.
Bednorz and Müeller, "Possible High $T_c$ Superconductivity in the Ba-La-Cu-O System", Z. Phys. B—Condensed Matter 64, pp. 189-193 (1986).
H. Maeda, Y. Tanaka, M. Fukutomi, and Y. Asano, "A New High $T_c$ Superconductor Without a Rare Earth Element", Japanese Journal of Applied Physics, vol. 27, No. 2, pp. L209 & L210.
Hakuraku et al., "Superconducting Thin Films of Bi-Pb-Sr-Ca-Cu-O by dc Magnetron Sputtering from a Single Target", Japanese Journal of Applied Physics, vol. 27, No. 11, Nov. 1988, pp. L2091-L2093.
Hoshino et al., "Preparation of Superconducting Bi-Sr-Ca-Cu-O Printed Thick Films on MgO Substrate and Ag Metal Tape", *Japanese Journal of Applied Physics*, vol. 27, No. 7, Jul. 1988, pp. L1297-1299.
Shimojima et al., "Preparation of High-Tc Superconductive Bi-Pb-Sr-Ca-Cu-O Film by Pyrolysis of Organic Acid Salts", *Japanese Journal of Applied Phyics*, vol. 28, No. 2, Feb. 1989, pp. L-226-228.

Primary Examiner—Shrive Beck
Assistant Examiner—Roy V. King
Attorney, Agent, or Firm—J. Jeffrey Hawley

[57] ABSTRACT

A process of forming on a gold, silver or platinum metal surface of a substrate a superconductive crystalline mixed metal oxide thin film exhibiting superconductivity at a temperature in excess of 85° K. A precursor of the superconductive thin film containing bismuth, strontium, calcium and copper is formed on the substrate surface and then thermally converted in the presence of oxygen to the superconductive thin film. Lead is added to the thin film precursor to raise the superconductivity of the completed thin film above 85° K.

11 Claims, 3 Drawing Sheets

PROCESS OF FORMING A HIGH TEMPERATURE SUPERCONDUCTOR ON A METAL SUBSTRATE SURFACE

This is a continuation of U.S. Ser. No. 623,639, filed Dec. 7, 1990, now abandoned.

FIELD OF THE INVENTION

The invention relates to the field of high temperature superconductivity. More specifically, the invention relates to a process of preparing a high temperature superconductive film on the surface of substrate.

BACKGROUND OF THE INVENTION

Since the initial publication of Bednorz and Müeller, "Possible High $T_c$ Superconductivity in the Ba-La-Cu-O System", Z. Phys. B—Condensed Matter 64, p. 189-193 (1986), investigation has revealed a large family of crystalline oxides which exhibit superconductivity at higher temperatures than previously thought possible. The terms "high temperature superconductor" and "high temperature superconductive" are herein employed to describe as a class those crystalline oxides that are capable of exhibiting superconductivity at temperatures greater than 30° K.—i.e., $T_o > 30°$ K. The term "$T_o$" is employed to indicate the superconductivity onset temperature—i.e., the highest temperature at which superconductivity is observed. The term "$T_c$" is employed to indicate the onset critical temperature, the temperature at which a transition to superconductivity begins.

H. Maeda, Y. Tanaka, M. Fukutomi, and Y. Asano, "A New High $T_c$ Superconductor Without a Rare Earth Element", Japanese Journal of Applied Physics, Vol 27, No. 2, pp. L209 & L210, first reported that at least one compound of bismuth, strontium, calcium, copper, and oxygen had been found to be superconducting.

One of the difficulties that has arisen in attempting to form films of bismuth mixed alkaline earth copper oxides that are superconducting at the highest attainable temperatures is that the conductive films are comprised of a mixture of different crystalline phases. Investigations have suggested that there are at least two bismuth mixed alkaline earth copper oxide crystalline phases present both having a pseudotetragonal crystal structure with crystal cell a and b axes of 5.4 Å, but differing in the length of their crystal cell c axes.

The less desirable of these phases, exhibiting a $T_c$ of 85° K., appears to be formed of an oxide containing bismuth strontium calcium and copper in the proportions $Bi_2Sr_2CaCu_2$. This lower onset $T_c$ superconductive phase is also referred to as the BSCCO-2212 phase. This crystalline phase can be identified by a crystal cell 30.7 Å c axis and an X-ray diffraction angle of 5.8° for the (002) line.

A more desirable phase, exhibiting a higher $T_c$ of 110° K., appears to be formed of an oxide containing bismuth strontium calcium and copper in the proportions $Bi_2Sr_2Ca_2Cu_3$. This higher $T_c$ phase is also referred to as the BSCCO-2223 phase. This crystalline phase can be identified by a crystal cell 37 Å c axis and an X-ray diffraction angle of 4.9° for the (002) line.

Lelental and Romanofsky U.S. Ser. No. 546,458, filed Jun. 29, 1989, titled PROCESSES OF FORMING CONDUCTIVE FILMS AND ARTICLES SO PRODUCED, commonly assigned, discloses that the proportion of the BSCCO-2223 phase in a thin film can be increased by satisfying the metal ratio:

M:Cu is > 1.00 where

M is bismuth and 0 to 50 percent lead, based on bismuth and lead combined. The possibility of coating on a silver or gold barrier layer is disclosed.

Mir et al U.S. Pat. No. 4,988,674 discloses a process of forming a flexible article by coating a release layer of gold, silver or a platinum metal on a refractory substrate and overcoating the release layer with a conductive cuprate layer. After the conductive cuprate layer has been formed, a protective layer can be coated over it, and subsequently the protective layer, conductive cuprate layer and release layer can be stripped from the refractory substrate to produce a flexible electrical conductor.

Hakuraku et al, "Superconducting Thin Films of Bi-Pb-Sr-Ca-Cu-O by DC Magnetron Sputtering from a Single Target", Japanese Journal of Applied Physics, Vol. 27, No. 11, Nov. 1988, pp. L2091–L2093, reports successfully preparing a 110° K. $T_c$ phase containing thin film on a magnesia substrate using a target consisting of bismuth, lead, strontium, calcium, copper and oxygen.

Hoshino et al, "Preparation of Superconducting Bi-Sr-Ca-Cu-O Printed Thick Films on MgO Substrate and Ag Metal Tape", Japanese Journal of Applied Physics, Vol. 27, No. 7, July, 1988, pp. L1297–299, reports preparing thick films on a silver substrate surface having zero resistance at 76° K. using powders with a nominal ratio of Bi:Sr:Ca:Cu of 1:1:1:2.

Shimojima et al, "Preparation of High-Tc Superconductive Bi-Pb-Sr-Ca-Cu-O Film by Pyrolysis of Organic Acid Salts," Japanese Journal of Applied Physics, Vol. 28, No. 2, Feb. 1989, pp. L-226–228, reports forming a high Tc phase (a 2223 phase) by employing a ratio of Bi:Pb:Sr:Ca:Cu of 0.7:0.3:1.0:1.0:1.8.

SUMMARY OF THE INVENTION

In one aspect this invention is directed to a process of forming on a surface of a substrate a superconductive crystalline mixed metal oxide thin film exhibiting superconductivity at a temperature in excess of 85° K. and containing a crystalline superconductive phase exhibiting a 37 Å crystal cell c-axis by the steps of (a) forming a precursor of the superconductive thin film on the substrate surface containing bismuth, lead, copper and a combination of the alkaine earths calcium and A, where A is strontium and 0 to 10 percent barium, based on strontium and barium combined in the proportions required to form the 37 Å crystal cell c-axis superconductive phase and (b) thermally converting the thin film precursor to the superconductive thin film.

The process is characterized in that (i) the substrate surface is comprised of at least one of silver, gold or a platinum group metal, (ii) at least 0.7 atom of lead for each four atoms of the alkaline earths is added to the thin film precursor to enhance formation of the 37 Å crystal cell c-axis superconductive phase on the substrate support surface, and (iii) at least two atoms of bismuth are maintained in the thin film precursor for each four atoms of the alkaline earths.

The present invention leads to a number of advantages not heretofore realized. High temperature superconductive thin films containing a significant proportion of bismuth strontium calcium copper oxide in its 37 Å c axis unit cell crystalline form having a $T_c$ of 110° K. have been previously achieved only on metal oxide substrates having a highly compatible crystalline form, such as magnesia. When less than optimum substrates have been employed as thin film formation surfaces, the bismuth strontium calcium copper oxide has reverted either to a low temperature superconductive form or its high temperature superconductive form having a 30.7 Å c axis unit cell crystalline form having a $T_c$ of 85° K.

This invention makes possible for the first time thin films exhibiting superconductivity at temperatures above 85° K. formed of bismuth strontium calcium copper oxides coated on a metal substrate surface. This in turn results in the ability to form these highly advantageous superconductive thin films as flexible articles using a metal foil as a substrate. Being able to achieve these high superconducting temperatures on metal substrate surfaces allows thin film superconductive articles to be produced that are much more readily adapted to a variety of user applications than is possible using rigid metal oxide substrates.

DESCRIPTION OF PREFERRED EMBODIMENTS

The present invention is directed to a process of forming on a metal substrate surface a superconductive crystalline mixed metal oxide thin film exhibiting superconductivity at a temperature in excess of 85° K. This is achieved by coating bismuth, strontium, calcium and copper on the metal substrate surface to form a thin film precursor on the metal substrate surface. Bismuth, strontium, calcium and copper are coated in any of the compound forms and proportions known to be useful precursors in forming a 37 Å crystal cell c-axis superconductive phase on a {100} magnesia substrate. It is has been discovered that, by forming the thin film precursor in the presence of lead, formation of the 37 Å crystal cell c-axis superconductive phase is enhanced during subsequent thermal conversion of the thin film precursor to a superconductive thin film.

The substrates employed in the practice of the process can take any convenient form presenting at least one metal surface. The substrate and the metal forming its surface must, of course, be capable of withstanding the processing temperatures required for producing the superconductive thin film, typically heating to at least about 820° C. in the presence of oxygen. When both chemical and physical compatibility with the preparation process are taken into account, the preferred metals for the practice of this invention are the metals of groups 8 to 11 in periods 5 and 6 metals. That is, silver, gold and the platinum group metals. The term "platinum group metals" is used in its customary sense to indicate the metals of groups 8 to 10 in periods 5 and 6. All of the substrate surface metals, with the exception of silver, have the common feature of a high degree of nobility (resistance to oxidation). The work function of each of these metals, other than silver, is greater than 4.5 eV, putting them among the highest work function metals.

Unlike the more noble substrate metals, silver is believed to undergo oxidation during the process. Fortuitously, however, the oxide is unstable under processing conditions, so that metallic silver at the substrate surface is never depleted.

In a preferred form of the invention the substrate is comprised of any one or combination of silver, gold and the platinum group metals. Metal substrates have the advantage that they can be varied in shape before, during or after the steps of the process have been performed. A specifically preferred feature of the metal substrates is that they can be used to form flexible superconductive articles. The metal substrate can conveniently take the form of a metal foil. The foil can take any thickness that permits handling and use without damage, typically at least about 10 μm in thickness. Metal foils with some degree of flexibility can range in thickness up to 500 μm. Optimum foil thicknesses are in the range of from about 20 to 100 μm.

Instead of forming the substrate entirely of metal the substrate can take the form of any combination of the required surface providing metal and one or more other process compatible materials. For example, the metal can form a coating on a surface of a refractory oxide or semiconductor substrate. When the underlying substrate material is itself compatible with forming the desired high temperature superconductive thin film, it is apparent that the metal thickness is entirely a matter of choice, depending on other considerations, such as its electrical conductivity. It is generally preferred that the metal coating have a thickness sufficient to insure the formation of a continuous coating, typically at least 2000 Å. When the metal layer has a thickness of at least about 1 μm, any substrate material which remains stable at processing temperatures can be chosen. Any of the substrate materials (with or without barrier materials) disclosed in Mir et al U.S. Pat. No. 4,880,770; Strom et al U.S. Pat. No. 4,908,346 and Hung et al U.S. Pat. No. 4,908,348; can be employed as substrates for the metals required for the practice of this process.

After selecting the substrate, the next step of the process is to coat on the metal surface of the substrate a precursor of the superconductive thin film sought as a product. Bismuth, strontium, calcium and copper are coated in any of the compound forms and proportions known to be useful as precursors in forming a 37 Å crystal cell c-axis superconductive phase on a {100} magnesia substrate. However, since bismuth, strontium, calcium and copper precursors will not alone produce a 37 Å crystal cell c-axis superconductive phase on a metal surface, further modification of the precursor composition is required.

It is the discovery of this invention that thin films exhibiting superconductivity at temperatures in excess of 85° C. can be formed of the substrate metal surface by including in the thin film precursor at least 0.7 atom of lead and at least two atoms of bismuth for each four atoms of the alkaline earths to enhance the formation of the 37 Å crystal cell c-axis superconductive phase on the substrate metal surface. The alkaline earths are preferably calcium and strontium or calcium and a mixture of barium and strontium, where barium accounts for 0 to 10 percent of the mixture.

In one contemplated form the metal content of the thin film precursor satisfies the relationship:

$$Bi_aPb_bIIA_cCu_d \tag{I}$$

where
  a is at least 2.0;
  b is 0.7 to 3.0, most preferably 0.9 to 1.3;
  a+b is 2.7 to 10, most preferably 2.9 to 6;
  IIA is a combination of the alkaline earth elements A and Ca in the ratio of 1:3 to 3:1;
  A is strontium and 0 to 10 percent barium, based on barium and strontium combined;
  c is 4.0; and
  d is from 2.5 to 8, preferably 3.0 to 5.0.

Other metals, such as antimony, not incompatible with the properties sought can also be present, but it is generally preferred to eliminate nonessential metals. Since barium is not a required component, it is usually preferred to simplify thin film precursor preparation by employing calcium and strontium as the sole alkaline earth metals.

Since lead readily lends itself to forming compounds corresponding to those of bismuth conventionally employed in forming thin film precursors, all of the same conventional procedures for forming bismuth strontium calcium copper compound thin film precursors can be readily adapted by the addition of a lead component to the preparation of the thin film precursors of this invention. The thin film precursor can be produced by sputtering, using an oxide target having the same or similar proportions of metals to those sought in the thin film precursor. Such a technique is, for example, illustrated by Hakuraku et al, cited above and here incorporated by reference. Metal oxide deposition by coevaporation can also be undertaken as disclosed by Yoshitake, T. Satoh, Y. Kubo, and H. Igarashi, "Preparation of Thin Films by Coevaporation and Phase Identification in Bi-Sr-Ca-Cu-O System", *Japanese Journal of Applied Physics, Vol.* 27, No. 6, June 1988 pp. L1089–L1091 here incorporated by reference, can be employed.

Preferred procedures for preparing bismuth, lead, alkaline earth and copper (hereinafter also indicated as (Bi/Pb)-IIA-C) thin film precursors are identical, except for the metal relationships noted above, to the procedures described in Agostinelli et al U.S. Pat. No. 4,950,643, the disclosure in Agostinelli et al incorporated by reference. To form a thin film precursor the substrate metal surface is coated with a solution consisting essentially of a volatilizable film forming solvent and metal-ligand compounds of each of the metals Bi, Pb, IIA, and Cu containing at least one thermally decomposable ligand. The solvent and ligands are removed from the substrate by heating to form an initial mixture of the metals and oxygen, which may be in the form of an oxide or an oxide intermediate (e.g., a carbonate).

To form the thin film precursor layer a solution of a film forming solvent, a bismuth compound, a lead compound, at least two alkaline earth metal compounds, and a copper compound is prepared. Each of the compounds consists of metal ion and one or more volatilizable ligands. Most useful metal-ligand compounds (e.g., metalorganic compounds) thermally decompose to form metal oxides. Some metal compounds, in particular some alkaline earth organic compounds, can form metal carbonates on decomposition, which can then be converted to oxides during heating to crystallization temperatures. A ligand oxygen atom bonded directly to a metal is often retained with the final superconductive thin film, although other ligand oxygen atoms are generally removed. Typically the ligands and their component atoms other than oxygen are outgassed at temperatures of less than 600° C. On the other hand, to avoid loss of materials before or during initial coating of the metal-ligand compounds, it is preferred that the ligands exhibit limited, if any, volatility at ambient temperatures. Metal-ligand compounds having any significant volatility below their decomposition temperature are preferably avoided.

Metalorganic (including metallo-organic and organometallic) compounds, such as metal alkyls, alkoxides, $\beta$-diketone derivatives, and metal salts of organic acids—e.g., carboxylic acids, constitute preferred metal-ligand compounds for preparing thin film precursor coatings. The number of carbon atoms in the organic ligand can vary over a wide range, but is typically limited to less than 30 carbon atoms to avoid unnecessarily reducing the proportion of metal ions present. Carboxylate ligands are particularly advantageous in promoting metal-ligand solubility. While very simple organic ligands, such as oxalate and acetate ligands, can be employed in one or more metal-ligands compounds, depending upon the film forming solvent and other metal-ligand compound choices, it is generally preferred to choose organic ligands containing at least 4 carbon atoms. The reason for this is to avoid crystallization of the metal-ligand compound and to improve solubility. When heating is begun to remove the film forming solvent and ligands, the solvent usually readily evaporates at temperatures well below those required to remove the ligands. This results in leaving the metal-ligand compounds on the substrate surface. When the ligands have few carbon atoms or, in some instances, linear carbon atom chains, crystallization of the metal-ligand compounds occurs. In extreme cases crystallization is observed at room temperatures. This works against the molecular level uniformity of heavy pnictide, alkaline earth, and copper sought by solution coating. Choosing organic ligands exhibiting 4 or more carbon atoms, preferably at least 6 carbon atoms, and, preferably, ligands containing branched carbon atom chains, reduces molecular spatial symmetries sufficiently to avoid crystallization. Optimally organic ligands contain from about 6 to 20 carbon atoms.

Instead of increasing the molecular bulk or modifying the chain configuration of organic ligands to avoid any propensity toward metalorganic compound crystallization on solvent removal, another technique which can be employed is to incorporate in the film forming solvent a separate compound to act as a film promoting agent, such as a higher molecular weight branched chain organic compound. This can, for example, take the form of a branched chain hydrocarbon or substituted hydrocarbon, such as a terpene having from about 10 to 30 carbon atoms.

The film forming solvents can be chosen from a wide range of volatilizable liquids. The primary function of the solvent is to provide a liquid phase permitting molecular level intermixing of the metalorganic compounds chosen. The liquid is also chosen for its ability to cover the substrate uniformly. Thus, an optimum film forming solvent selection is in part determined by the substrate chosen. Generally more desirable film forming properties are observed with more viscous solvents and those which more readily wet the substrate alone, or with an incorporated wetting agent, such as a surfactant, present.

It is appreciated that a wide variety of ligands, film promoting agents, and film forming solvents are available and can be collectively present in a virtually limitless array of composition choices.

Exemplary preferred organic ligands for metal organic compounds include metal 2-ethylhexanoates, naphthenates, neodecanoates, butoxides, isopropoxides, rosinates (e.g., abietates), cyclohexanebutyrates, and acetylacetonates, where the metal can be any of M, IIA, or Cu to be incorporated in the M-IIA-Cu-O layer. Exemplary preferred film forming agents include 2-ethylhexanoic acid, rosin (e.g., abietic acid), ethyl lactate, 2-ethoxyethyl acetate, and pinene. Exemplary preferred film forming solvents include toluene, 2-ethylhexanoic acid, n-butyl acetate, ethyl lactate, propanol, pinene, and mineral spirits.

As previously noted, the metal-ligand compounds are incorporated in the film forming solvent in the proportion desired in the final crystalline PAC layer. The bismuth, lead, alkaline earth, and copper can each be reacted with the same ligand forming compound or with different ligand forming compounds. The metal-ligand compounds can be incorporated in the film forming solvent in any convenient concentration up to their saturation limit at ambient temperature. Generally a concentration is chosen which provides the desired superconductive thin film thickness for the process sequence. Where the geometry of the substrate permits, uniformity and thickness of the metal-ligand coating can be controlled by spinning the substrate after coating around an axis normal to the surface of the substrate which has been coated. A significant advantage of spin coating is that the thickness of the coating at the conclusion of spinning is determined by the contact angle and viscosity of the coating composition and the rate and time of spinning, all of which can be precisely controlled. Differences in the amount of the coating composition applied to the substrate are not reflected in the thickness of the final coating. Centrifugal forces generated by spinning cause excess material to be rejected peripherally from the article.

The enhanced formation of the desired higher onset transition ($T_c$ 110° K., crystal cell c-axis 37 Å) phase can be enhanced by appropriately choosing firing temperatures and times. It is preferred to employ firing temperatures ranging from 820° to 870° C. (optimally 840° to 860° C.) and firing times of at least 20 minutes. Maximum firing times are a matter of choice and can be extend up to 700 hours or more, if desired. Optimum firing times are in the range of from 2 to 400 hours. The time and temperature of firing are to some extent complementary. Hence, the shorter firing times are generally employed with the higher firing temperatures and the longer firing times with the lower firing temperatures. The object in firing is to form a solidus mixture of liquid and solid phases in equilibrium that facilitates phase formation, crystal growth, and orientation.

Crystallization to form the superconductive thin film is undertaken in the presence of oxygen. Any convenient oxygen containing atmosphere can be employed, including oxygen or oxygen in combination with a nonreactive gas. In the latter instance oxygen preferably constitutes from 5 to 95 percent of the atmosphere on a volume basis. A mixture of oxygen and argon constitutes a specifically preferred atmosphere for firing because of the low levels of gaseous impurities. It is specifically contemplated to employ air as the atmosphere during firing. In this instance the nonreactive gas component is principally present in the form of nitrogen. The superconductivity of the thin films shows little response to variances in cooling and/or annealing following crystal formation.

The lead introduced in the thin film precursor is largely removed during conversion of the thin film precursor to the superconductive thin film. Trace levels of lead, indicative of the original presence of lead, are retained. The volatility of lead oxide at the firing temperatures is responsible for the loss of lead. Ideally the final film consists essentially of BSCCO-2223—i.e., $Bi_2Sr_2Ca_2Cu_3O_{10\pm\Delta}$, where $\Delta=0.2$. In this form the superconductive thin film consists essentially of the $T_c$ 110° K., 37 Å unit cell c-axis phase, which exhibits the highest attainable superconductive temperatures employing combinations of bismuth, strontium, calcium and copper. Barium, if substituted for a minor portion of the strontium, as indicated above, does not reduce superconductivity. In practice a mixture the high temperature superconductive $T_c$ 110° K., 37 Å unit cell c-axis and $T_c$ 85° K., 30.7 Å unit cell c-axis ($Bi_2Sr_2CaI-Cu_2O_{8\pm\Delta}$, where $\Delta=0.2$) phases are formed. Since the substrate surface on which these phases are formed is an electrically conductive metal providing a parallel conduction path, it is not possible to determine the $T_c$ of the superconductive thin film. It has been observed, however, that the superconductive thin films produced in the articles of this invention exhibit superconductivity onset temperatures ($T_o$) that exceed 85° K., the $T_c$ of the 30.7 Å unit cell c-axis phase. This provides a conclusive indication that the 110° K., 37 Å unit cell c-axis phase is present in an amount sufficient to increase the $T_o$ of the superconductive film. A relatively small amount of low temperature superconductivity $T_c$ 10° K., 24 Å unit cell c-axis phase has also been observed in the superconductive thin films produced by the process of this invention. Small amounts of other crystalline phases may also be present.

As employed herein, the term "thin film" refers to a crystalline oxide film having a thickness of less than 5 μm. Preferred thin films are those having a thickness of less than 3 μm. In forming crystalline oxide thin films the thin film precursors from which the thin films are formed undergo a marked reduction in thickness during processing. Thus, thin film precursors in the form of amorphous oxides having layer thicknesses of up to 20 μm (preferably less than 12 μm) are capable of forming crystalline oxide thin films. When an amorphous oxide thin film precursor is produced by thermally decomposing a layer of metalorganic compounds, the latter, containing a substantial fraction of components that are removed by heating, can have thicknesses of up to 100 μm, but preferably have thicknesses of less than 60 μm. To achieve thin films of the highest levels of uniformity it is preferred that the amorphous oxide thin film precursors be built to their final form in thickness increments of 1 μm or less to achieve the highest attainable levels of coating uniformity.

EXAMPLES

The invention can be better appreciated by reference to the following specific embodiments of the invention:

EXAMPLE 1A (Control)

A precursor solution BSCC-PS1 (3.2:2:2:3) of the following composition was spin coated onto the {100} magnesium oxide (MgO) wafer:

6.06 g of 2-ethylhexanoic acid solution of bismuth acetate (AESAR-11846 TM) containing 16.0 weight percent of bismuth 2.32 g of 2-ethylhexanoic acid solution of calcium 2-ethylhexanoate (EK 10124 TM) containing 5.0 weight percent of calcium 1.22 g of strontium cyclohexanebutyrate powder (EK 10413 TM) containing 20.8 weight percent of strontium 4.34 g of 2-ethylhexanoic acid solution of copper acetate, $Cu(CH_3COO)_2H_2O$, (J. F. Baker -1766-1 TM), containing 6.4 weight percent of copper 1.05 g of Rosin (EK 2315 TM)

BSCC-PS1 was refluxed for 1 min, allowed to cool to room temperature, and then filtered using a 1.2 μm filter.

Figure 1A:
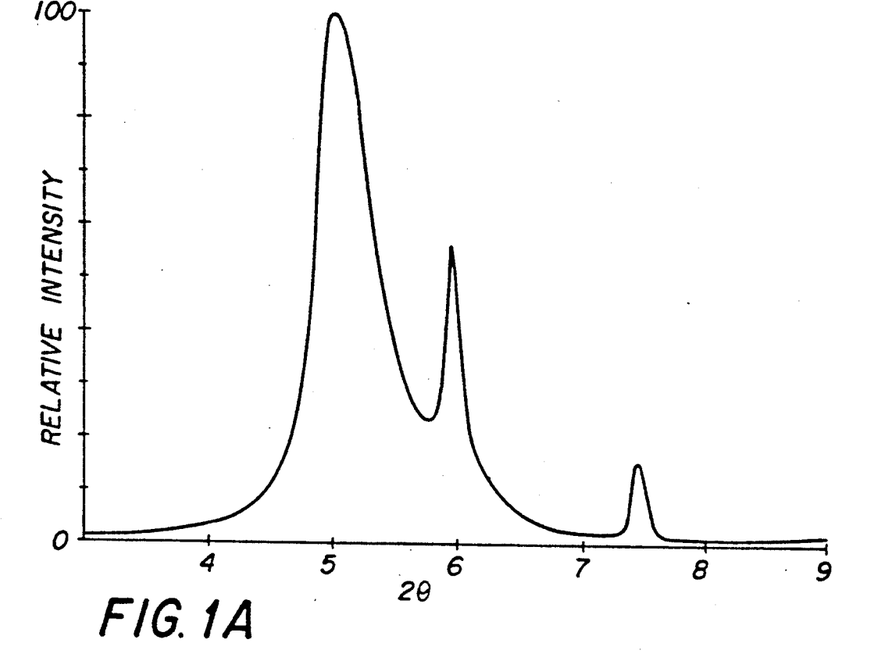
FIGS. 1A, 1B and 3 are plots of the X-ray diffraction scattering angle 2Θ versus relative intensity.

A coating of BSCC-PS1 was then produced on the {100} MgO single crystal substrate by spinning the MgO wafer at 4000 RPM for 20 sec. The precursor coating was heated in air to 450° C. on a hot plate to decompose the bismuth, strontium, calcium, and copper carboxylates. This coating and heating procedure was performed 4 times in sequence. A bismuth oxide, strontium carbonate, calcium carbonate and copper oxide thin film precursor layer was formed by baking in oxygen at 650° C. for 5 min in a Fisher Model 495 TM ashing furnace. The thin film precursor was converted to an electrically conductive, crystalline BSCCO, $T_c$ 110° K. superconducting film by heating in oxygen to 897° C. in the ashing furnace. The sample was held at this temperature for 12 hr and allowed to cool to 450° C. at a rate of 15° C. min, left to anneal at this temperature for 1 hr and then allowed to cool slowly at a rate of 5° C. per minute. The low-angle x-ray diffraction (XRD) pattern of the BSCCO film is shown in FIG. 1A.

A diffraction peak at 4.8° corresponds to the (002) reflection for the BSCCO phase with a unit cell c-axis of 37 Å which is responsible for superconductivity with $T_c=110$° K. A diffraction peak at 5.7° corresponds to the (002) reflection for the 85° K., unit cell c-axis 30.7 Å phase, and a 7.2° peak corresponds to the (002) reflection for the 10° K., unit cell c-axis 24 Å phase. In FIG. 1A each of these peaks are present, although displaced about 0.3° due to a sample mounting variance. The XRD pattern shown in FIG. 1A indicates that the film of this example contains a high volume fraction of the 110° K. phase.

The standard four-probe technique was used to measure film resistance as a function of temperature. Contacts were made using gold bonding pads fabricated by pyrolysis of gold organometallic precursor (Liquid Bright Gold TM Engelhard Corp.).

Figure 2:
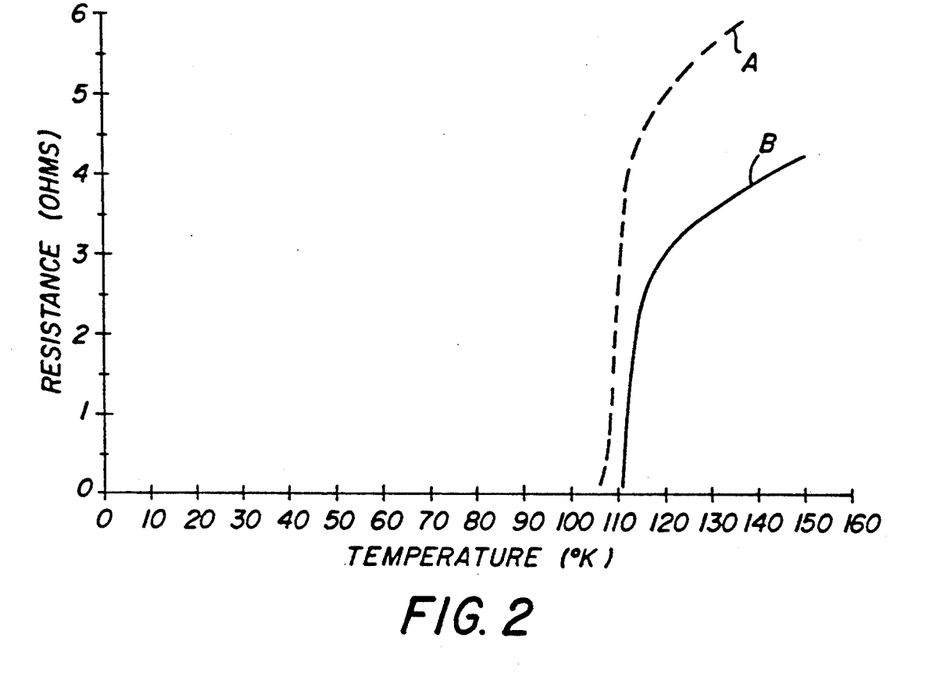
FIGS. 2 and 4 are plots of temperature in °K. versus resistance in ohms.

Curve A in FIG. 2 shows resistance vs. temperature data indicating that this film exhibited a superconductivity onset temperature ($T_o$) of 101° K.

EXAMPLE 1B (Control)

A lead doped Bi(2)Pb(1.1)Sr(2)Ca(2)Cu(3) film was prepared and characterized as described in Example 1A, except that 0.8836 g of lead cyclohexanebutyrate powder (EK 10395 TM) was substituted for 2.27 g of 2-ethylhexanoic acid solution of bismuth acetate containing 16% weight of bismuth in the MOD precursor solution of Example 1A. A four-layer coating of the BSCCO film was then produced as described in Example 1. An electrically conductive, $T_o=110$° K. superconducting, crystalline BSCCO thin film was fabricated by heating for 12 hr at 894° C. using the procedure described in Example 1A.

Figure 1B:
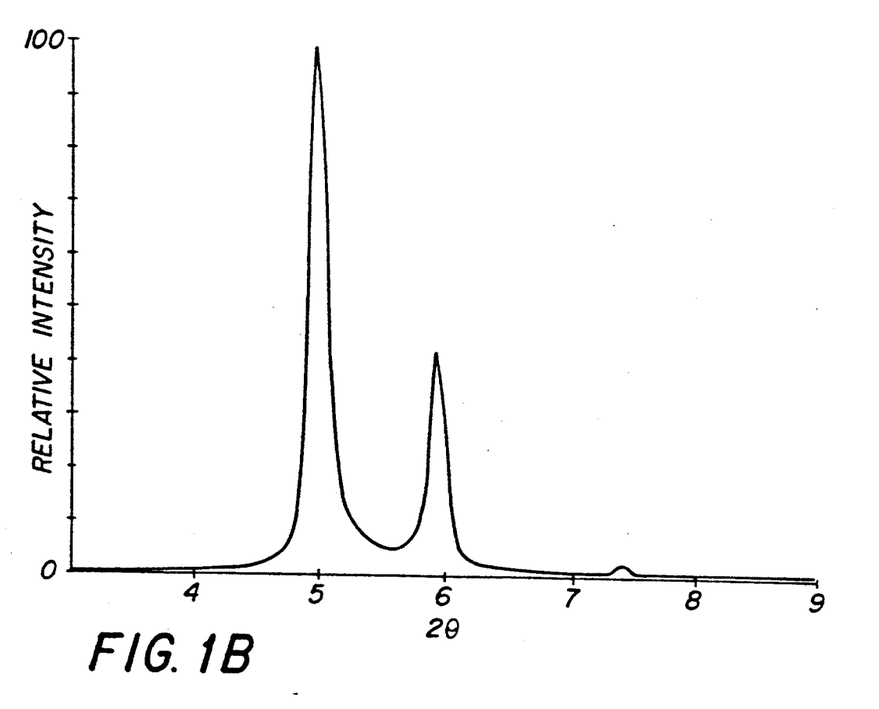

The XRD pattern shown in FIG. 1B indicated that the 110° K. to 85° K. phase ratio in this film was similar to the 110° K.:85° K. phase ratio in the film of Example 1A.

Curve B in FIG. 2 shows resistance vs temperature data indicating that the films of Examples 1A and 1B exhibited similar R vs T behavior.

EXAMPLE 2A (Control)

A precursor solution BSCC-PS2 (2:2:2:3) of the following composition was spin coated onto a polycrystalline, 50 micrometer thick silver foil substrate (Handy and Harman):

3.79 g of 2-ethylhexanoic acid solution of bismuth acetate (AESAR-11846 TM) containing 6.0 weight percent of bismuth 2.32 g of 2-ethylhexanoic acid solution of calcium 2-ethylhexanoate (EK 10124 TM) containing 5.0 weight percent of calcium 1.22 g of strontium cyclohexanebutyrate powder (EK No. 10413 TM) containing 20.8 weight percent of strontium 4.34 g of 2-ethylhexanoic acid solution of copper acetate ($Cu(CH_3COO)_2H_2O$), J. F. Baker-1766-1 TM) containing 6.4 weight percent of copper 1.05 g of Rosin (EK 2315 TM)

1.00 g of 2-ethylhexanoic acid.

The BSCCO precursor solution was refluxed for 1 min, allowed to cool to room temperature, and then filtered using a 1.2 μm filter.

Figure 3:
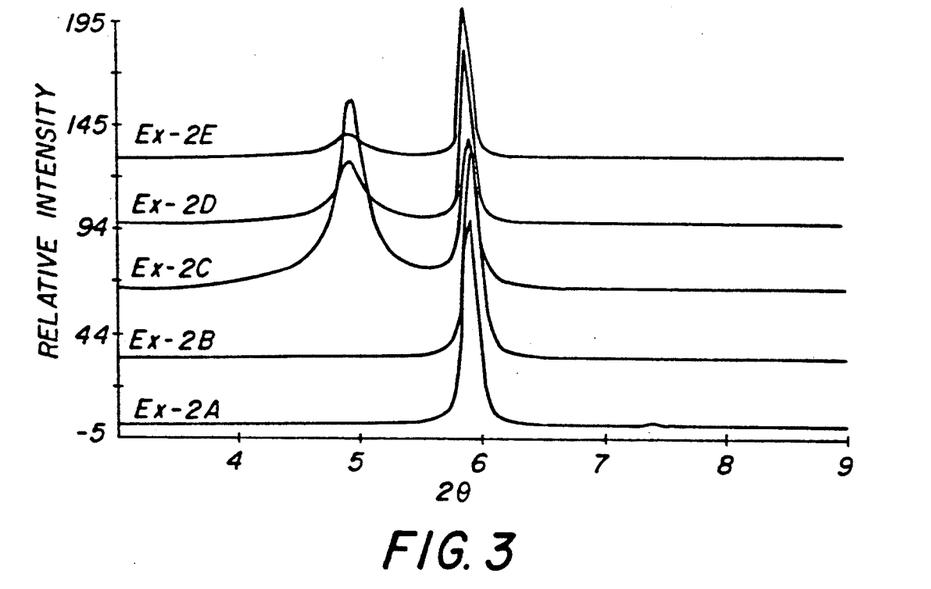

BSCC-PS2 was then coated on the silver foil substrate by spinning the substrate at 4000 RPM for 20 sec. The precursor coating was heated in air to 450° C. on a hot plate to decompose bismuth, strontium, calcium and copper carboxylates. This coating and heating procedure was repeated to form a two layer bismuth oxide, strontium carbonate, calcium carbonate and copper oxide thin film precursor. The thin film precursor was preliminarily baked and then converted to an electrically conductive, crystalline BSCCO, $T_o=110$° K. superconducting thin film by heating for 12 hr at 855° C. using the procedure described in Example 1A. The XRD pattern of this film is shown in FIG. 3 (Example 2A).

The absence of the 4.8° line corresponding to the (002) reflection for the 37 Å phase that is responsible for superconductivity with $T_c=110$° K., indicates that the concentration of this phase in this film was below the detection limit of our XRD analytical procedure.

EXAMPLES 2B-2F

A series of Bi(2)Pb(x)Sr(2)Ca(2)Cu(3) precursor solutions and corresponding thin films were prepared and characterized as described in Example 2A, except that different amounts of lead cyclohexane butyrate (LCB) powder (EK 10395 TM) containing 37.4 weight percent of lead were added (Table I) into the precursor solution of Example 2A.

TABLE I

| Ex. | Grams of LCB added to 12.7 g solution 2A | $Bi_2Pb(x)Sr_2Ca_2Cu_3$ | Sintering Temp/Time | $(RVF_{110°K})XRD$* |
|---|---|---|---|---|
| 2B | 0.56 | x = 0.7 | 885° C. /12h | 0 |
| 2C | 0.88 | x = 1.1 | " | 0.56 |
| 2D | 1.20 | x = 1.5 | " | 0.28 |
| 2E | 1.60 | x = 2.0 | " | 0.13 |
| 2F | 2.40 | x = 3.0 | " | 0.16 |

$$*(RVF_{110K})XRD = \frac{(I_{110°K.})^{(002)}}{(I_{110°K.})^{(002)} + (I_{85°K.})^{(002)}}$$

Relative Volume Fraction of the 110° K. Phase

The XRD patterns of the thin films of Examples 2A, 2B, 2C, 2D and 2E are shown in FIG. 3. For ease of visualization each successive thin film curve is displaced vertically on the relative intensity scale, otherwise the curves would be largely overlapping. The intensity of the (002) diffraction lines provides a comparison of the relative concentration of a given phase in the region of the film that contributes to the x-ray signal. In this work $(RVF_{110°K.})XRD$ defined as shown in Table I was used as a measure of the relative volume fraction of the 110° K. phase present in the mixed 85° K.-110° K. phase films. The $(RVF_{110°K.})XRD$ data listed in Table I indicate that the $Pb(x) \geq 1.1$ films contain volume fractions of the 110° K. phase that are significantly greater than those present in the lead-free or $Pb(x) \leq 0.7$ films.

Figure 4:
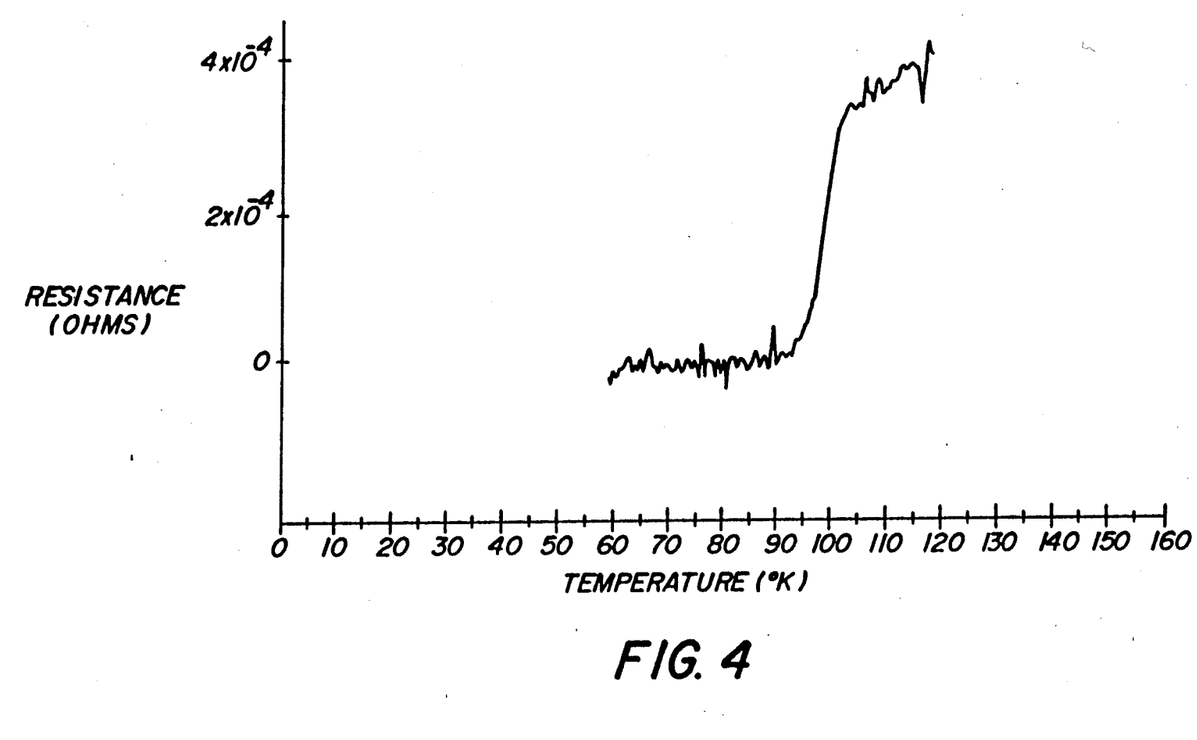

FIG. 4 shows R vs T data for the BSCCO(Pb) silver film of Example 2C. This film exhibited an onset of superconducting transition at $T_c > 100°$ K. and zero resistance state at $T_o = 92°$ K.

EXAMPLES 3-13

Bi(2)Pb(x)Sr(2)Ca(2)Cu(3) films (Tables II and III) were prepared and characterized as described in Examples 2A-2F, except that sintering times and temperatures were varied as listed in Table II and Table III. The $(RVF_{110°K.})XRD$ data presented in these tables indicate that the $Pb(x) \geq 1.1$ films contained volume fractions of the 110° K. phase that were significantly greater than those present in the lead-free or $Pb(x) \leq 0.7$ films.

EXAMPLES 15 AND 16

Bi(3.2)Pb(0)Sr(2)Ca(2)Cu(3) thin films (Examples 15A-15D, Table IV) and Bi(2)Pb(1.1)Sr(2)Ca(2)Cu(3) films (Examples 16A-16D, Table IV) were prepared on silver foil substrate as described in Examples 1A and 1B, respectively, except that sintering temperatures were varied as shown in Table IV.

TABLE II

| | | $Bi_2(Pb)xSr_2Ca_2Cu_3$ | | |
|---|---|---|---|---|
| Ex. | Lead Stoichiometry | Temp/(°C.) | Sintering Time/(hr) | $(RVF_{110°K.})XRD$ |
| 3A | x = 0 | 830 | 12 | 0 |
| 3B | x = 0.7 | " | " | 0 |
| 3C | x = 1.1 | " | " | 0.21 |
| 3D | x = 1.5 | " | " | 0.10 |
| 3E | x = 2.0 | " | " | 0.11 |
| 3F | x = 3.0 | " | " | 0.10 |
| 4A | x = 0 | 840 | 12 | 0 |
| 4B | x = 0.7 | " | " | 0 |
| 4C | x = 1.1 | " | " | 0.28 |
| 4D | x = 1.5 | " | " | 0.09 |
| 4E | x = 2.0 | " | " | 0.07 |
| 4F | x = 3.0 | " | " | 0.13 |
| 5A | x = 0 | 845 | 12 | 0 |
| 5B | x = 0.7 | " | " | 0 |
| 5C | x = 1.1 | " | " | 0.34 |
| 5D | x = 1.5 | " | " | 0.08 |
| 5E | x = 2.0 | " | " | 0.07 |
| 5F | x = 3.0 | " | " | 0.14 |
| 6A | x = 0 | 850 | 12 | 0 |
| 6B | x = 0.7 | " | " | 0 |
| 6C | x = 1.1 | " | " | 0.77 |
| 6D | x = 1.5 | " | " | 0.19 |
| 6E | x = 2.0 | " | " | 0.13 |
| 6F | x = 3.0 | " | " | 0.34 |
| 7A | x = 0 | 860 | 12 | 0 |
| 7B | x = 0.7 | " | " | 0.06 |
| 7C | x = 1.1 | " | " | 0.70 |
| 7D | x = 1.5 | " | " | 0.62 |
| 7E | x = 2.0 | " | " | 0.22 |
| 7F | x = 3.0 | " | " | 0.53 |
| 8A | x = 0 | 870 | 12 | 0 |
| 8B | x = 0.7 | " | " | 0.08 |
| 8C | x = 1.1 | " | " | 0.30 |
| 8D | x = 1.5 | " | " | 0.21 |
| 8E | x = 2.0 | " | " | 0.01 |
| 8F | x = 3.0 | " | " | 0 |

TABLE III

| | | $Bi_2(Pb)xSr_2Ca_2Cu_3$ | | |
|---|---|---|---|---|
| Ex. | Lead Stoichiometry | Temp/(°C.) | Sintering Time/(hr) | $(RVF_{110°K.})XRD$ |
| 9A | x = 0 | 855 | 0.33 | 0 |
| 9B | x = 0.7 | " | " | 0 |
| 9C | x = 1.1 | " | " | 0.04 |
| 9D | x = 1.5 | " | " | 0 |
| 9E | x = 2.0 | " | " | 0 |
| 9F | x = 3.0 | " | " | 0 |
| 10A | x = 0 | 855 | 1.0 | 0 |
| 10B | x = 0.7 | " | " | 0 |
| 10C | x = 1.1 | " | " | 0.43 |
| 10D | x = 1.5 | " | " | 0.13 |
| 10E | x = 2.0 | " | " | 0.03 |
| 10F | x = 10.0 | " | " | 0.01 |
| 11A | x = 0 | 855 | 2 | 0 |
| 11B | x = 0.7 | " | " | 0 |
| 11C | x = 1.1 | " | " | 0.34 |
| 11D | x = 1.5 | " | " | 0.10 |
| 11E | x = 2.0 | " | " | 0.06 |
| 11F | x = 3.0 | " | " | 0.11 |
| 12A | x = 0 | 855 | 6 | 0 |
| 12B | x = 0.7 | " | " | 0 |
| 12C | x = 1.1 | " | " | 0.63 |
| 12D | x = 1.5 | " | " | 0.23 |
| 12E | x = 2.0 | " | " | 0.13 |
| 12F | x = 3.0 | " | " | 0.29 |
| 13A | x = 0 | 855 | 18 | 0 |
| 13B | x = 0.7 | " | " | 0 |
| 13C | x = 1.1 | " | " | 0.95 |
| 13D | x = 1.5 | " | " | 0.31 |
| 13E | x = 2.0 | " | " | 0.23 |
| 13F | x = 3.0 | " | " | 0.44 |
| 14A | x = 0 | 855 | 36 | 0 |
| 14B | x = 0.7 | " | " | 0 |
| 14C | x = 1.1 | " | " | 0.96 |
| 14D | x = 1.5 | " | " | 0.33 |
| 14E | x = 2.0 | " | " | 0.27 |
| 14F | x = 3.0 | " | " | 0.33 |

TABLE IV

| | | $Bi_2(Pb)xSr_2Ca_2Cu_3$ | | |
|---|---|---|---|---|
| Ex. | Lead Stoichiometry | Temp/(°C.) | Sintering Time/(hr) | $(RVF_{110°K.})XRD$ |
| 15A | 1 | 855 | 12 | 0 |
| 15B | 1 | 850 | " | 0 |
| 15C | 1 | 840 | " | 0 |
| 15D | 1 | 830 | " | 0 |
| 16A | 2 | 855 | 12 | 0.86 |

TABLE IV-continued $Bi_2(Pb)xSr_2Ca_2Cu_3$

| Ex. | Lead Stoichiometry | Temp/(°C.) | Sintering Time/(hr) | $(RVF_{110°\ K.})XRD$ |
|---|---|---|---|---|
| 16B | 2 | 850 | " | 0.60 |
| 16C | 2 | 840 | " | 0.67 |
| 16D | 2 | 830 | " | 0.15 |

*Stoichiometry:
1. Bi(3.2)-Pb(0)-Sr(2)-Ca(2)-Cu(3)
2. Bi(2.0)-Pb(1.1)-Sr(2)-Ca(2)-Cu(3)

The $(RVF_{110°\ K.})XRD$ data shown in Table IV indicate the absence of detectable concentration of the crystalline, 110° K., BSCCO phase in the bismuth-rich, lead-free, films (Examples 15A–15D). However, corresponding Pb(1.1) samples contained a significant volume fraction of the 110° K. phase (Example 16A–16D).

The invention has been described in detail with particular reference to preferred embodiments thereof, but it will be understood that variations and modifications can be effected within the spirit and scope of the invention.

What is claimed is:

1. A process of forming on a surface of a substrate a superconductive crystalline mixed metal oxide thin film exhibiting superconductivity at a temperature in excess of 85° K. and containing a crystalline superconductive phase exhibiting a 37 Å crystal cell c-axis by the steps of
   forming a precursor of the superconductive thin film on the substrate surface containing bismuth, lead, copper and a combination of the alkaline earths A and calcium, where A is strontium and 0 to 10 percent barium, based on strontium and barium combined in the proportions required to form the 37 Å crystal cell c-axis superconductive phase and
   thermally converting the thin film precursor to the superconductive thin film,
   characterized in that
   the substrate surface is comprised of at least one of silver, gold or a platinum group metal,
   at least 0.7 atom of lead for each four atoms of the alkaline earths is in the thin film precursor to enhance formation of the 37 Å crystal cell c-axis superconductive phase on the substrate support surface, and
   at least two atoms of bismuth are maintained in the thin film precursor for each four atoms of the alkaline earths.

2. A process according to claim 1 further characterized in that the thin film precursor satisfies the relationship:

$$Bi_aPb_bIIA_cCu_d \qquad (I)$$

where
   a is at least 2.0;
   b is from 0.7 to 3.0;
   a+b is from 2.7 to 10;
   IIA is a combination of the alkaline earth elements A and Ca in the ratio of 1:3 to 3:1;
   c is 4.0; and
   d is from 2.5 to 8.

3. A process according to claim 2 further characterized in that
   b is from 0.9 to 1.3;
   a+b is from 2.9 to 6;
   c is 4.0; and
   d is from 3.0 to 5.0.

4. A process according to claim 1 further characterized in that the substrate is a metal foil.

5. A process according to claim 4 further characterized in that the foil has a thickness of at least 10 μm.

6. A process according to claim 1 further characterized in that the step of thermally converting the thin film precursor is comprised of heating the thin film precursor in the presence of oxygen to a temperature in the range of from 820° to 870° C. for a period of at least 20 minutes.

7. A process according to claim 6 further characterized in that the thin film precursor is heated to a temperature in the range of from 840° to 860° C.

8. A process according to claim 1 further characterized in that the thin film precursor is formed with a thickness of less than 20 μm and a superconductive thin film having a thickness of less than 5 μm.

9. A process according to claim 8 further characterized in that the substrate is flexible and the substrate with the superconductive thin film formed on its surface is flexible.

10. A process according to claim 9 further characterized in that the substrate presents a silver surface.

11. A process according to claim 9 further characterized in that the substrate presents a gold surface.

* * * * *